United States Patent
Grover et al.

(10) Patent No.: US 6,895,295 B1
(45) Date of Patent: May 17, 2005

(54) METHOD AND APPARATUS FOR CONTROLLING A MULTI-CHAMBER PROCESSING TOOL

(75) Inventors: Jason A. Grover, Austin, TX (US); Sam H. Allen, Jr., New Braunfels, TX (US); Michael R. Conboy, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 332 days.

(21) Appl. No.: 10/140,468

(22) Filed: May 6, 2002

(51) Int. Cl.[7] .............................................. G06F 19/00
(52) U.S. Cl. ......................... 700/121; 700/109; 438/14
(58) Field of Search ........................... 700/121, 97, 99, 700/100, 105, 1, 108–110; 438/14, 16; 356/237.3–237.5; 702/84; 430/30, 313

(56) References Cited

U.S. PATENT DOCUMENTS 5,940,175 A * 8/1999 Sun ......................... 356/237.3
6,625,497 B2 * 9/2003 Fairbairn et al. ............... 700/1
2003/0165755 A1 * 9/2003 Mui et al. ..................... 430/30

\* cited by examiner

*Primary Examiner*—Leo Picard
*Assistant Examiner*—Steven R. Garland
(74) *Attorney, Agent, or Firm*—Williams, Morgan & Amerson

(57) ABSTRACT

A method for controlling a processing tool having a plurality of chambers includes processing a wafer in a first chamber of the processing tool; measuring a characteristic of the wafer; and modifying an operating recipe of one of the plurality of chambers based on the measured characteristic. A system for processing semiconductor wafers includes a processing tool, a metrology tool, and a process controller. The processing tool includes a plurality of chambers. The metrology tool is adapted to measure a characteristic of a wafer processed in a first chamber of the processing tool. The process controller is adapted to modify an operating recipe of one of the plurality of chambers based on the measured characteristic.

18 Claims, 3 Drawing Sheets

METHOD AND APPARATUS FOR CONTROLLING A MULTI-CHAMBER PROCESSING TOOL

BACKGROUND OF THE INVENTION

1. Field of the Invention

This invention relates generally to the field of semiconductor device manufacturing and, more particularly, to a method and apparatus for controlling a multi-chamber processing tool.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Many modern integrated circuit devices are very densely packed, i.e., there is very little space between the transistors formed above the substrate. The manufacture of semiconductor devices requires a number of discrete process steps to create a packaged semiconductor device from raw semiconductor material. The various processes include the initial growth of the semiconductor material, the slicing of the semiconductor crystal ingot into individual wafers, the fabrication stages (etching, doping, ion implanting, and the like), and the packaging and final testing of the completed device.

As technology advances facilitate smaller critical dimensions for semiconductor devices, the need for reduction of errors increases dramatically. Proper formation of subsections within a semiconductor device is an important factor in ensuring proper performance of the manufactured semiconductor device. Critical dimensions of the subsections generally have to be within a predetermined acceptable margin of error for semiconductor devices to be within acceptable manufacturing quality and performance ranges.

Certain types of tools used to process semiconductor wafers include multiple processing chambers and paths. The tools, commonly referred to as multi-chamber processing tools, are operated using a plurality of operating recipes. The operating recipes may vary between chambers of different types and even among chambers of the same type. Wafers are loaded into one end of the processing tool and progress through the tool as the various processing steps are performed. One exemplary multi-chamber tool is a tool that performs an etch process in one chamber and a photoresist stripping process in another chamber. Typically, the tool has multiple etch chambers and multiple strip chambers. The path through the tool may vary. For example, the wafers processed in one of the etch chambers may not necessarily progress to the same strip chamber for the next processing step. During the setup of the tool, the operating recipes of the chambers are configured to handle a range incoming wafer characteristics (e.g., photoresist layer thickness). The variations inherent in the incoming wafers, as well as the variations introduced by proceeding through different paths through the processing tool, result in corresponding variations in the outgoing product.

For example, because of variations in the incoming photoresist layer thicknesses, the strip process includes a predetermined amount of overstrip time (i.e., strip time in excess of the time required to remove a photoresist layer with average thickness). Accurate control of the stripping process is important for preventing defects in the wafer. If the photoresist strip time is too short (i.e., understripping), remnants of the photoresist layer will be present on the wafer, interfering with subsequent processing steps. If the strip time is too long (i.e., overstripping), the wafer may be damaged by unnecessary exposure to ion charging effects, and also the processing time for completing the wafer is lengthened. Typically, a minimum strip time designed to provide a certain amount of overstripping to ensure complete removal of the photoresist is programmed into the recipe of the developer. However, variations in the photoresist, developer, photoresist layer thickness, etc., may result in different photoresist strip rates for various wafers in the same or different lots. Accordingly, a minimum strip time does not always ensure that all of the photoresist is removed. Raising the strip time to encompass such process variations could result in wafer damage and lengthen processing time.

The present invention is directed to overcoming, or at least reducing the effects of, one or more of the problems set forth above.

SUMMARY OF THE INVENTION

One aspect of the present invention is seen in a method for controlling a processing tool having a plurality of chambers. The method includes processing a wafer in a first chamber of the processing tool; measuring a characteristic of the wafer; and modifying an operating recipe of one of the plurality of chambers based on the measured characteristic.

Another aspect of the present invention is seen in a system for processing semiconductor wafers including a processing tool, a metrology tool, and a process controller. The processing tool includes a plurality of chambers. The metrology tool is adapted to measure a characteristic of a wafer processed in a first chamber of the processing tool. The process controller is adapted to modify an operating recipe of one of the plurality of chambers based on the measured characteristic.

BRIEF DESCRIPTION OF THE DRAWINGS

The invention may be understood by reference to the following description taken in conjunction with the accompanying drawings, in which like reference numerals identify like elements, and in which.

Figure 1:
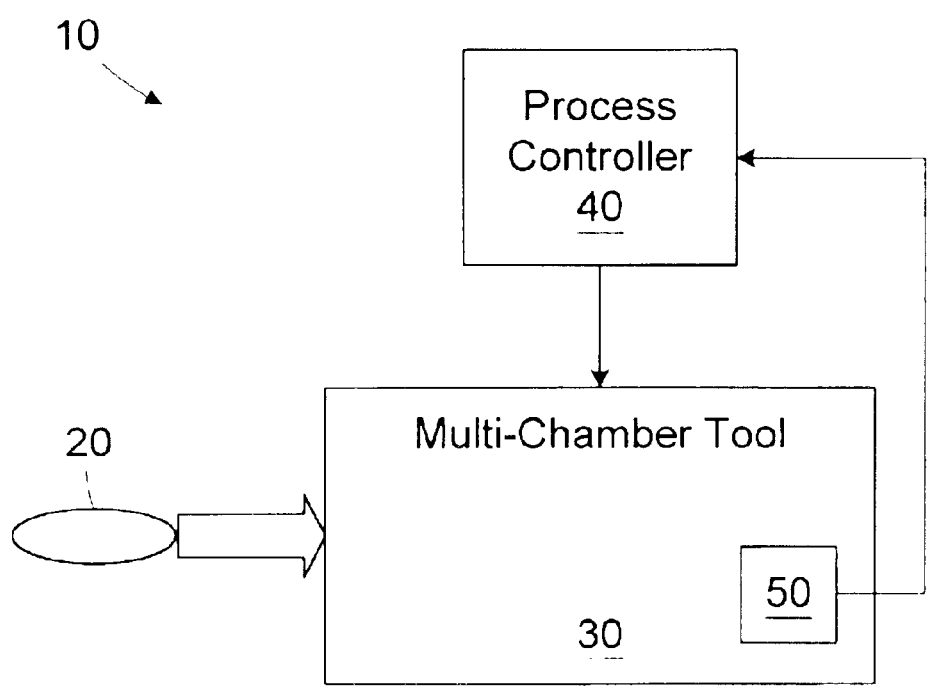
FIG. 1 is a simplified block diagram of a portion of a processing line for manufacturing semiconductor devices in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the figures, and first to FIG. 1, a simplified block diagram of a portion of an illustrative processing line 10 for processing wafers 20 in the manufacture of semiconductor devices in accordance with one exemplary embodiment of the present invention is provided. The processing line 10 includes a multi-chamber tool 30 for processing the wafers 20 in accordance with a plurality of operating recipes and a process controller 40 for automatically controlling the operating recipes. The multi-chamber tool 30 includes a plurality of processing chambers for performing processes on the wafers 20. Each chamber has an associated operating recipe, dependent on the particular process being performed. The multi-chamber tool 30 also includes an in-situ metrology tool 50, hereinafter referred to as the metrology tool 50, for measuring characteristics of the wafers 20 at various points during the processing performed by the multi-chamber tool 30. Within the context of this specification, an in-situ measurement tool refers to a tool that may measure a characteristic of the wafer without requiring the wafer to be transferred to an external measurement tool. The measurement tool 50 may be integrated with the multi-chamber tool 30 or, alternatively, the measurement tool 50 may be an add-on type of tool.

The process controller 40 receives data from the metrology tool 50 and adjusts the operating recipes of the multi-chamber tool 30 to control the functions performed by the various chambers of the multi-chamber tool 30. The multi-chamber tool 30 is described in an illustrative embodiment that includes the performance of etch processes and photoresist strip processes. However, the application of the present invention is not so limited, in that it the teachings included herein may be applied to a variety of multi-chamber tools performing various functions.

An exemplary tool suitable for performing the functions of the multi-chamber tool 30 is a Model 5000 or 5200 etch tool offered by Applied Materials, Inc. In the illustrated embodiment, the metrology tool 50 measures wafer characteristics such as process layer thickness. An exemplary tool suitable for performing the functions of the metrology tool 50 is an Opti-Probe thickness metrology tool offered by Therma-Wave, Inc. of Freemont Calif. In some embodiments, where it may be desirable to measure multiple wafer characteristics, multiple metrology tools 50 may be used. The metrology tools 50 may be integrated with the multi-chamber tool 30, or alternatively, the metrology tool 50 may be of an add-on type, where it measures a wafer characteristic through a port electrically or mechanically communicating with the multi-chamber tool 30.

In the illustrated embodiment, the process controller 40 is a computer programmed with software to implement the functions described. However, as will be appreciated by those of ordinary skill in the art, a hardware controller designed to implement the particular functions may also be used. Moreover, the functions performed by the process controller 40, as described herein, may be performed by multiple controller devices distributed throughout a system. Additionally, the process controller 40 may be a stand-alone controller, it may be resident on the multi-chamber tool 30, or it may be part of a system controlling operations in an integrated circuit manufacturing facility. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the process controller 40 as described is the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699- Provisional Specification for CIM Framework Domain Architecture) and APC (SEMI E93-0999 Provisional Specification for CIM Framework Advanced Process Control Component) specifications are publicly available from SEMI.

Figure 2:
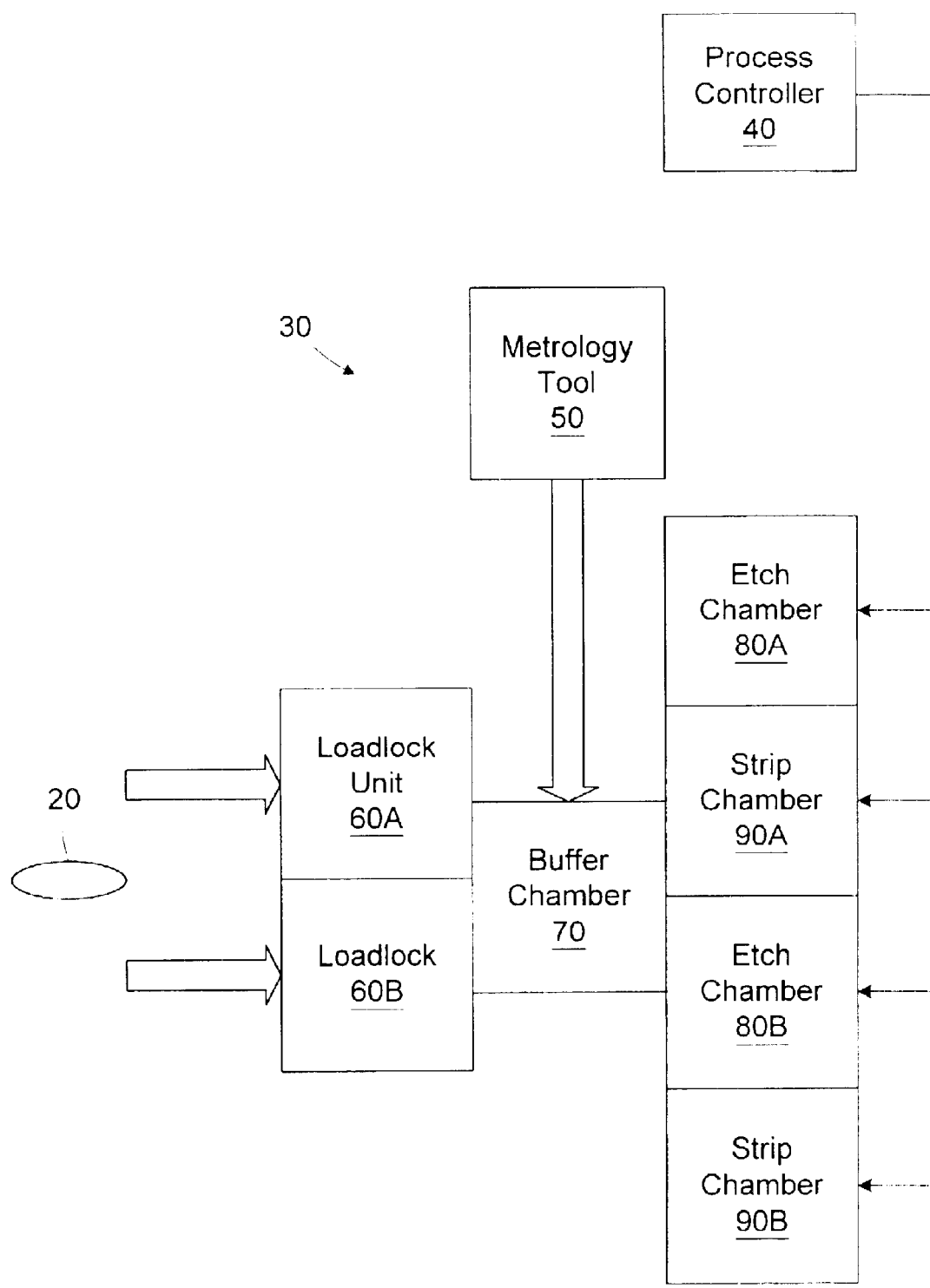
FIG. 2 is a simplified block diagram of a multi-chamber tool in the processing line of FIG. 1.

Turning now to FIG. 2, a simplified block diagram of the multi-chamber tool 30 is provided. The multi-chamber tool 30 includes two loadlock units 60A, 60B for transferring wafers 20 from a conventional wafer carrier (not shown) into the multi-chamber tool 30. Wafers 20 are transferred from the loadlock units 60A, 60B into a buffer chamber 70, where they await further processing. From the buffer chamber 70, a wafer 20 passes to one of a pair of etch chambers 80A, 80B, where an etch process is performed. For example, the wafers 20 may include a metal layer upon which a photoresist layer has been deposited and developed to form a pattern that is desired to be transferred to the underlying layer of metal. The etch chambers 80A, 80B may perform a metal etching process, such as an anisotropic plasma etch to remove portions of the metal layer exposed through the openings patterned in the photoresist layer. After being processed in one of the etch chambers 80A, 80B, the wafer 20 is transferred back to the buffer chamber 70. Subsequently, the etched wafer 20 is placed in one of a pair of strip chambers 90A, 90B, where a plasma stripping process is employed to remove the remaining portions of the photoresist layer. The metrology tool 50 may measure characteristics of the wafers 20 at various points during the processing.

In the illustrated embodiment, the metrology tool 50 is shown interfacing with the buffer chamber 70. For example, the buffer chamber may include an optical port through which the metrology tool 50 may measure a characteristic of the wafer, such as the thickness of the metal layer or the thickness of the photoresist layer. The metrology tool 50 may also be disposed within the buffer chamber 70. In still other embodiments, the metrology tool 50 may measure a characteristic of the wafer 20 as it is removed from one of the etch chambers 80A, 80B or strip chambers 90A, 90B (i.e., between chambers).

Based on the characteristics measured by the metrology tool 50, the process controller 40 updates the operating recipes of the etch chambers 80A, 80B and/or strip chambers 90A, 90B. For example, the metrology tool 50 may measure the thickness of the process layer after the etch process and feed the layer measurement to the process controller 40. The process controller then uses the thickness measurement to generate strip parameters for removing the remaining portions of the etched process layer. Exemplary strip parameters include strip time, plasma power, reactant gas flow rates, etc.

In general, the process controller 40 uses the metrology data in conjunction with one or more control models relating the measured characteristic to a particular operating recipe parameter to reduce the deviation between the measured characteristic and a target characteristic value. For example, the control model may be developed empirically using commonly known linear or non-linear techniques. The control model may be a relatively simple equation based model (e.g., linear, exponential, weighted average, etc.) or a more complex model; such as a neural network model, principal component analysis (PCA) model, or a projection to latent structures (PLS) model. The specific implementation of the model may vary depending on the modeling technique selected.

In changing the chamber recipes, process controller 40 may change a parameter or parameters within a baseline recipe or, alternatively, the process controller 40 may provide an entirely new recipe. The process controller 40 may change the chamber recipes in a feedback mode or in a feedforward mode of operation. In a feedback mode, the metrology data gathered by the metrology tool 50 may be used in conjunction with a target value for the measured parameter to determine a new operating recipe for subsequently processed wafers in the particular chamber. In a feedforward mode, the process controller 40 may use the metrology data and predict operating recipe parameters for controlling the chamber responsible for performing the next processing step on the wafer. Subsequent measurements may be used to update the predictive model for subsequent wafers.

Chamber models may be generated by the process controller 40, or alternatively, they may be generated by a different processing resource (not shown) and stored on the process controller 40 after being developed. The chamber models may be developed using the multi-chamber tool 30 or using a different tool (not shown) having similar operating characteristics. For purposes of illustration, it is assumed that the chamber models are generated and updated by the process controller 40 or other processing resource based on the actual performance of the multi-chamber tool 30 as measured by the metrology tool 50. The chamber models are trained based on historical data collected from numerous processing runs of the multi-chamber tool 30.

Figure 3:
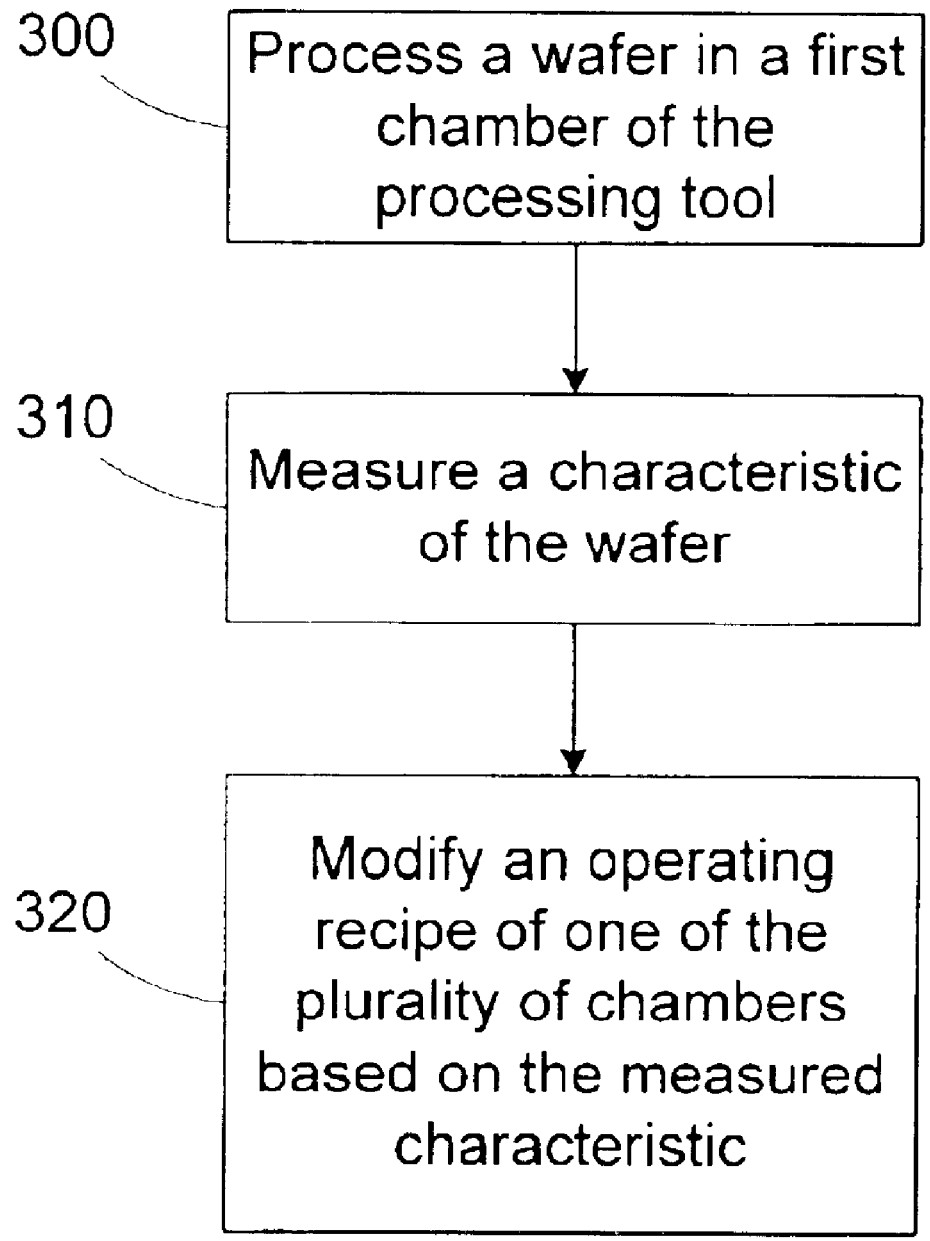
FIG. 3 is a simplified flow diagram of a method for controlling a multi-chamber processing tool in accordance with another embodiment of the present invention.

Referring now to FIG. 3, a simplified flow diagram of a method for controlling multi-chamber processing tool in accordance with another embodiment of the present invention. In block 300, a wafer is processed in a first chamber of the multi-chamber tool 30. The particular process performed in the chamber may vary. In block 310, a characteristic of the wafer is measured. Likewise, the particular characteristic measured may vary. In block 320, an operating recipe of one of the plurality of chambers is modified based on the measured characteristic. The operating recipe may be modified for the first chamber that processed the wafer is block 300 in a feedback mode of operation. The modified recipe would be used to process the next wafer. In another embodiment, the operating recipe of a chamber other than the first chamber may be modified. The chamber with the modified recipe may be used to perform an additional processing step on the wafer processed in block 300 in a feedforward mode of operation. The method may also include modifying the operating recipe of the first chamber and that of another chamber in an embodiment where both a feedback mode and a feedforward mode of operation are used.

Controlling the chamber recipes as described above reduces post processing variations in the wafers processed in the multi-chamber tool 30. Hence, a more stable, repeatable process is achievable. By using real-time control models to effect the variation reduction, the throughput of the processing line 10 and the quality of the end product may be increased. Increased throughput and reduced variation lead directly to increased profitability.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for controlling a processing tool including a plurality of chambers, comprising:

processing a wafer in a first chamber of the processing tool;

measuring a characteristic of the wafer, modifying an operating recipe of one of the plurality of chambers based on the measured characteristic; and providing the wafer to one of the plurality of chambers for processing according to the modified operating recipe.

2. The method of claim 1, wherein measuring the characteristic of the wafer comprises measuring the characteristic using a metrology tool interfacing with one of the plurality of chambers.

3. The method of claim 1, wherein measuring the characteristic of the wafer composes measuring the characteristic using a metrology tool interfacing with an optical port disposed on one of the plurality of chambers.

4. The method of claim 1, wherein measuring the characteristic of the wafer comprises measuring the characteristic using a metrology tool disposed within one of the plurality of chambers.

5. The method of claim 1, where measuring the characteristic of the wafer comprises measuring the characteristic as the wafer passes from one of the chambers to another of the chambers.

6. The method of claim 1, wherein modifying the operating recipe comprises modifying the operating recipe of a second chamber based on the measured characteristic.

7. The method of claim 1, wherein measuring the characteristic of the wafer comprises measuring a thickness of a process layer.

8. The method of claim 7, wherein modifying the operating recipe further comprising determining at least one of a processing time, a plasma power, and a reactant gas flow rate.

9. The method of claim 1, wherein processing the wafer in the first chamber comprises performing an etch process using a photoresist mask layer, measuring the characteristic of the wafer further comprises measuring a thickness of the photoresist mask layer, and modifying the operating recipe of one of the plurality of chambers based on the measured characteristic further comprising modifying the operating recipe of one of the plurality of chambers adapted to perform a strip process on the photoresist mask layer.

10. A system for processing semiconductor wafers, comprising:

a processing tool including a plurality of chambers;

a metrology tool adapted to measure a characteristic of a wafer processed in a first chamber of the processing tool; and a process controller adapted to modify an operating recipe of one of the plurality of chamber based on the measured characteristic such that the wafer is subsequently processed in one of the plurality of chambers according to the modified recipe.

11. The system of claim 10, the metrology tool interfaces with one of the plurality of chambers.

12. The system of claim 10, wherein the metrology tool interfaces with an optical port disposed on one of th plurality of chambers.

13. The system of claim 10, wherein the metrology tool is disposed within one of the plurality of chambers.

14. The system of claim 10, wherein the metrology tool is adapted to measure the characteristic of the wafer as the wafer passes from the first chamber to another of the plurality of chambers.

15. The system of claim 10, wherein the process controller is adapted to modify the operating recipe of a second chamber based on the measured characteristic.

16. The system of claim 15, wherein the process controller is further adapted to modify at least one of a processing time, a plasma power, and a reactant gas flow rate in the operating recipe.

17. The system of claim 10, wherein the first chamber comprises an etch chamber adapted to etch a process layer formed on the wafer through a photoresist mask layer, the metrology tool is further adapted to measure a thickness of the photoresist mask layer, and the process controller is adapted to modify the operating recipe of one of the plurality of chambers adapted to perform a strip process on the photoresist mask layer.

18. A system for controlling a processing tool including a plurality of chambers, comprising:

means for processing a wafer in a first chamber of the processing tool;

means for measuring a characteristic of the wafer;

means for modifying an operating recipe of one of the plurality of chambers base on the measured characteristic; and means for providing the wafer to one of the plurality of chambers for processing according to the modified recipe.

* * * * *